(12) United States Patent
Kobayashi (10) Patent No.: US 8,034,678 B2
(45) Date of Patent: Oct. 11, 2011

(54) COMPLEMENTARY METAL OXIDE SEMICONDUCTOR DEVICE FABRICATION METHOD

(75) Inventor: Takuya Kobayashi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 281 days.

(21) Appl. No.: 12/355,318

(22) Filed: Jan. 16, 2009

(65) Prior Publication Data

US 2009/0212371 A1  Aug. 27, 2009

(30) Foreign Application Priority Data

Jan. 17, 2008 (JP) ................ P2008-008508
Apr. 24, 2008 (JP) ................ P2008-114176

(51) Int. Cl.
*H01L 21/8238* (2006.01)

(52) U.S. Cl. ............. 438/199; 257/369; 257/E21.635

(58) Field of Classification Search ........... 257/369, 257/E21.635, E21.637, E21.639; 438/199
See application file for complete search history.

(56) References Cited

U.S. PATENT DOCUMENTS

| | | | |
|---|---|---|---|
| 7,326,631 B2 | 2/2008 | Lander et al. | |
| 7,326,632 B2 | 2/2008 | Kim | |
| 7,335,562 B2 | 2/2008 | Kobayashi et al. | |
| 2006/0065939 A1* | 3/2006 | Doczy et al. | 257/412 |
| 2006/0244035 A1* | 11/2006 | Bojarczuk et al. | 257/314 |
| 2007/0210354 A1 | 9/2007 | Nabatame et al. | |
| 2007/0228480 A1* | 10/2007 | Yen et al. | 257/369 |
| 2007/0278584 A1 | 12/2007 | Colombo et al. | |
| 2008/0203488 A1* | 8/2008 | Chung et al. | 257/369 |
| 2009/0014809 A1 | 1/2009 | Sekine et al. | |
| 2010/0176456 A1* | 7/2010 | Ikeno et al. | 257/369 |

FOREIGN PATENT DOCUMENTS

JP  2002-270821  9/2002

* cited by examiner

*Primary Examiner* — A. Sefer
*Assistant Examiner* — Allen Parker
(74) *Attorney, Agent, or Firm* — Finnegan, Henderson, Farabow, Garrett & Dunner, L.L.P.

(57) ABSTRACT

According to an aspect of the present invention, there is provided a method for fabricating a semiconductor device, the method including: forming a first region and a second region in a substrate; forming the high-permittivity insulating film on the substrate in the first region and in the second region; forming a nitride film on the high-permittivity insulating film in the second region; forming a cap film on the high-permittivity insulating film in the first region and on the nitride film in the second region; forming a metal film on the cap film; and performing a heating process.

6 Claims, 10 Drawing Sheets

COMPLEMENTARY METAL OXIDE SEMICONDUCTOR DEVICE FABRICATION METHOD

CROSS-REFERENCE TO RELATED APPLICATIONS

This application claims priority from Japanese Patent Application No. 2008-008508 filed on Jan. 17, 2008 and from Japanese Patent Application No. 2008-114176 filed on Apr. 24, 2008, the entire contents of which are incorporated herein by reference.

BACKGROUND OF THE INVENTION

1. Field of the Invention

An aspect of the present invention relates to a semiconductor device, and more particularly, to a CMOS (Complementary Metal Oxide Semiconductor) transistor and a fabrication method thereof.

2. Description of the Related Art

With the recent miniaturization of large scale integrated circuits, CMOS transistors are requested to achieve a thin gate insulating film. However, as the gate insulating film is made thinner and thinner, when a polysilicon film is used in a gate electrode, depletion of the gate electrode cannot be disregarded. For this reason, it has recently been investigated to use a metal electrode in the gate electrode, and in order to achieve a low threshold voltage in both a NMOS transistor and a PMOS transistor, there has been investigated a so-called dual gate structure where the gate electrode is formed using materials having different work functions.

Moreover, a proposal has been made to use a high-permittivity insulating film of, for example, Hf oxides, as the gate insulating film to thereby make the physical film thickness thicker, thus achieving an electrical thin film while suppressing a leak current. However, when the high-permittivity insulating film is used as the gate insulating film, in case of using polysilicon in the gate electrode, the polysilicon gate electrode may be depleted, and thus, the electrical film thickness increases. In this regard, it has been tried to use a combination of the high-permittivity gate insulating film and a metal gate.

As a high-permittivity gate insulating film of a next-generation MOSFET, an insulating film containing Hafnium (Hf) or Zirconium (Zr) is promising. However, in a CMOS transistor using a hafnium silicon oxynitride (HfSiON) film as the high-permittivity gate insulating film, because of a phenomenon called pinning, even when materials having different work functions are used, the flat band voltage (Vfb) cannot be adjusted to a band edge but is shifted to near a mid gap, thus making it impossible to achieve a low threshold voltage. In this regard, it has been found effective to use a cap film, especially containing lanthanoides in order to adjust the Vfb of a NMOSFET to the band edge (see JP-2002-270821-A, for example) However, forming the cap film in both NMOS and PMOS regions requires complicated and many steps including several repetitions of processes of film-forming, patterning, etching, and the like.

SUMMARY OF THE INVENTION

According to an aspect of the present invention, there is provided a method for fabricating a semiconductor device, the method including: forming a first region and a second region in a substrate; forming the high-permittivity insulating film on the substrate in the first region and in the second region; forming a nitride film on the high-permittivity insulating film in the second region; forming a cap film on the high-permittivity insulating film in the first region and on the nitride film in the second region; forming a metal film on the cap film; and performing a heating process.

According to another aspect of the present invention, there is provided a method for fabricating a semiconductor device, the method including: forming a first region and a second region in a substrate; forming the high-permittivity insulating film on the substrate in the first region and in the second region; substituting the high-permittivity insulating film into a nitrided high-permittivity insulating film in the second region so as to have a nitride concentration higher than that of the high-permittivity insulating film by performing a nitriding process; forming a cap layer on the high-permittivity insulating film in the first region and on the nitrided high-permittivity insulating film in the second region; forming a metal film on the cap film; and performing a heating process.

According to still another aspect of the present invention, there is provided a semiconductor device including: a semiconductor substrate that includes a first region and a second region; an NMOS transistor including: a first high permittivity insulating film that is formed on the semiconductor substrate in the first region; and a first metal gate electrode that is formed on the first high permittivity insulating film; and a PMOS transistor including: a second high permittivity insulating film that is formed on the semiconductor substrate in the second region; a nitride film that is formed on the second high permittivity insulating film; a cap layer that is formed on the nitride film; and a second metal gate electrode that is formed on the cap layer.

DETAILED DESCRIPTION OF THE INVENTION

The embodiments of the present invention will be described with reference to the accompanying drawings.

First Embodiment

FIGS. 1A to 1E and FIGS. 2A to 2E are cross-sectional views illustrating the steps for fabricating a CMOSFET according to a first embodiment of the present invention.

Figure 1A:
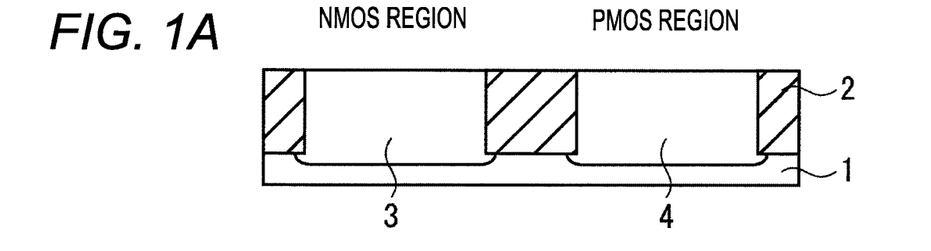
FIGS. 1A to 1E are cross-sectional views schematically illustrating parts of a semiconductor device fabrication method according to a first embodiment of the present invention.

First, as illustrated in FIG. 1A, on a main surface of a silicon (Si) substrate 1, a device isolation region 2 having an STI (Shallow Trench Isolation) structure is formed by a conventional method so as to define a PMOSFET forming region (hereinafter, simply referred to as a PMOS region) and a NMOSFET forming region (hereinafter, simply referred to as a NMOS region) The device isolation region 2 is formed, for example, by the following method. First, a silicon nitride film serving as a mask is deposited via a buffer film on the main surface of the silicon substrate 1. Next, by a pattern transfer method using a resist, the silicon nitride film and the buffer film are patterned to form a mask, and the silicon substrate 1 is etched to a given depth using the mask, thus forming a trench. Next, the resist is removed, and then, a silicon oxide film is deposited on the entire surfaces of the main surface of the silicon substrate 1, followed by patterning, e.g., by CMP (Chemical Mechanical Polishing), embedding an silicon oxide film in the trench, and removing the silicon nitride film and the buffer film used as the mask, thereby forming the device isolation region 2.

Figure 1B:
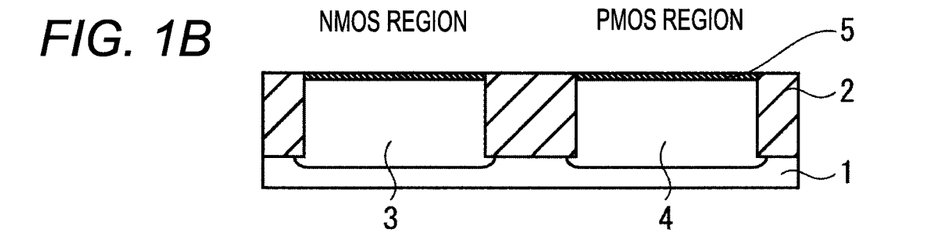

Thereafter, a P-well diffusion layer 3 in the NMOS region and an N-well diffusion layer 4 in the PMOS region are formed by a conventional method. Next, as illustrated in FIG. 1B, the main surface of the silicon substrate 1 is oxidized, e.g., by a heat treatment in an oxygen atmosphere so that a silicon oxide ($SiO_2$) film 5 is formed on the PMOS region and the NMOS region.

Figure 1C:
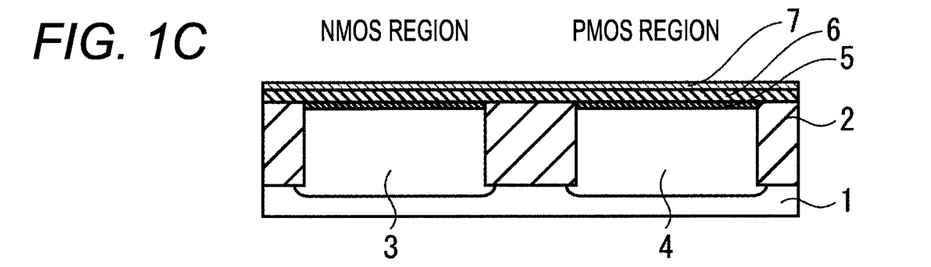

As illustrated in FIG. 1C, subsequent to forming the $SiO_2$ film 5, a HfSiO film as a high-permittivity gate insulating film 6 is deposited on the $SiO_2$ film 5 by a MOCVD method using tetra-dimethylamino-silicon and tetra-dimethylamino-hafnium, and an extremely thin silicon film 7 is formed on the HfSiO film 6, e.g., by an ALD method or a sputtering method.

The silicon film 7 has a thickness capable of preventing diffusion of Lanthanum elements when it is nitrided, for example, of about 0.5 to 1.0 nm. The silicon film 7 may be formed to have a larger thickness as long as the device characteristics are satisfied. It is preferable to acquire a sufficient conditioning data for the sputtering before the film formation using the sputtering is performed.

Figure 1D:
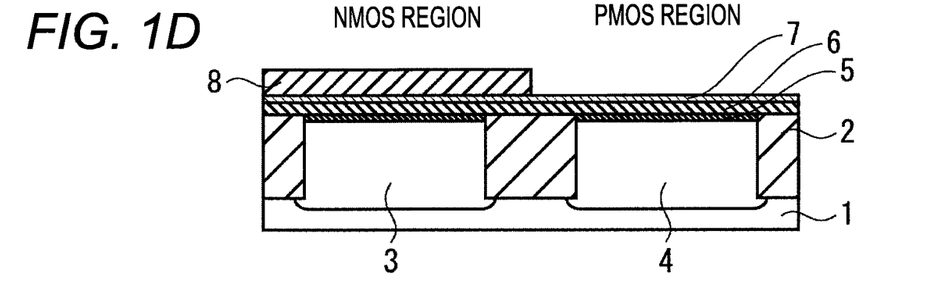
Figure 1E:
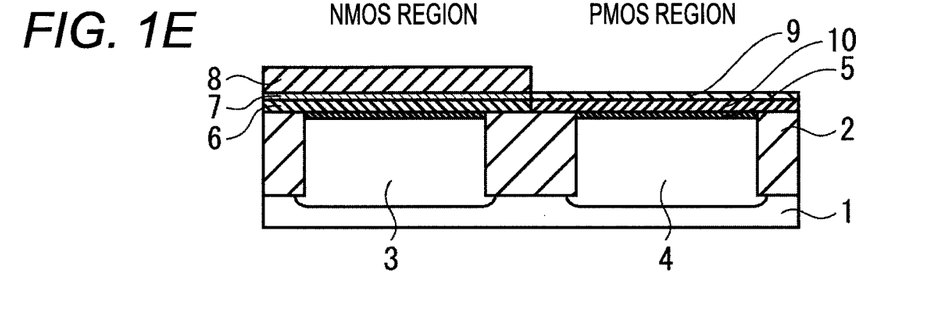

Thereafter, the NMOS region is masked by a resist 8 as illustrated in FIG. 1D through a photolithography method or the like, a nitriding, e.g., by a plasma nitriding method is performed on the silicon film 7 and the HfSiO film 6 of the PMOS region to substitute the silicon film 7 with a silicon nitride (SiN) film as illustrated in FIG. 1E. In the PMOS region, the HfSiO film 6 may also be nitrided in addition to the silicon film 7. In the present embodiment, since the silicon film 7 of the NMOS region is masked by the resist 8, the plasma nitriding treatment can be performed on the silicon film 7 and the HfSiO film 6 of the PMOS region at a low temperature, thereby preventing the resist from being deteriorated. In this way, a SiN film 9 and an HfSiON film 10 are formed on the PMOS region, and the silicon film 7 remains Unchanged on the NMOS region since the NMOS region is covered with the resist 8. It is considered that the characteristics of the resist 8 are not change much after the plasma nitriding treatment since the resist 8 is an organic material, and hence, the peering characteristic of the resist 8 is less affected.

Figure 2A:
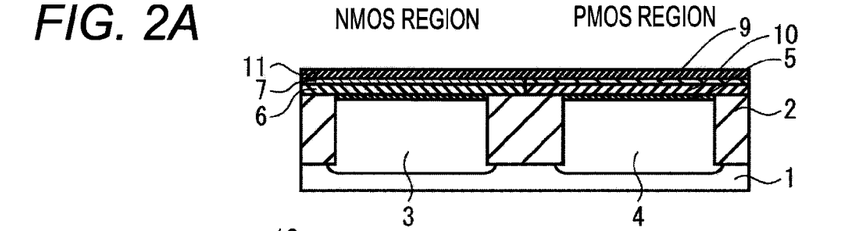
FIGS. 2A to 2E are cross-sectional views schematically illustrating parts of the semiconductor device fabrication method according to the first embodiment.

Next, as illustrated in FIG. 2A, the resist 8 is removed using an organic solvent or the like, and a Lanthanum (La) film as a cap film is formed on the silicon film 7 of the NMOS region and on the SiN film 9 of the PMOS region. In this embodiment, the La film is formed to lower a threshold voltage Vth of an NMOSFET. As the cap film, there may be used, in lieu of lanthanum, any of lanthanoides, actinoides, alkaline earth metals, and rare-earth metals, as well as yttrium, terbium, erbium, ytterbium, magnesium, and scandium. Generally, the La film is slightly oxidized during the process and exists in a state where a small amount of oxygen of is contained. In this description, the La film in such state is represented as a La(O) film 11. Similarly, in case of using Magnesium in place of Lanthanum, it is considered that it exists in the slightly oxidized state.

Figure 2B:
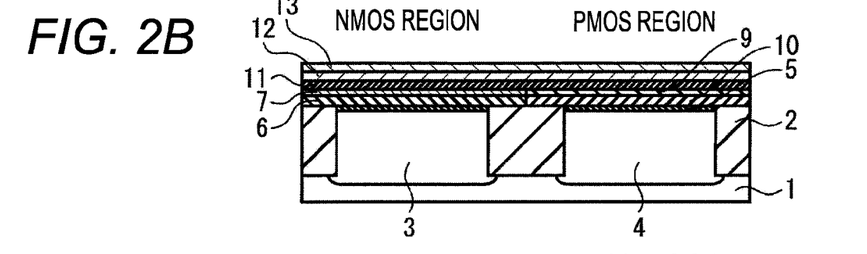
Figure 2C:
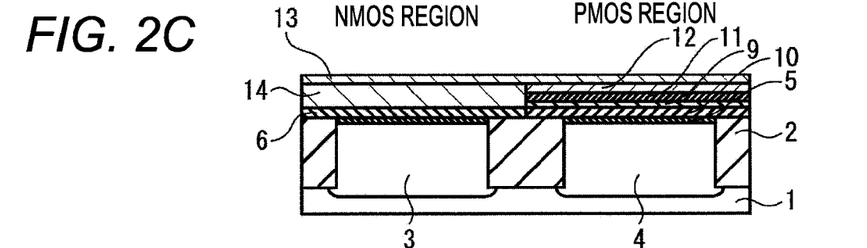

Subsequently, as illustrated in FIG. 2B, a W film 12 as a metal electrode is formed on the La(O) film 11, and a TiN film 13 as a barrier film is formed on the W film 12. After the TiN film 13 is formed, a heating process is performed whereby the La elements contained in the La(O) film 11 of the NMOS region are diffused near the interface of the silicon substrate 1 and the $SiO_2$ film 5. On the other hand, in the PMOS region, the SiN film 9 blocks the diffusion of the La elements, so that the La elements cannot be diffused toward the interface of the silicon substrate 1 and the $SiO_2$ film 5. Moreover, during the heating process, as illustrated in FIG. 2C, the W film 12 and the silicon film 7 react with each other in the NMOS region so that the W film 12 and the silicon film 7 are substituted with a WSi film 14. On the other hand, in the PMOS region, the W film 12, the La(O) film 11, the SiN film 9, and the HfSiON film 10 may remain unchanged.

Here, the reason why the SiN film 9 blocks the diffusion of the La elements will be described below. For example, when the La(O) film 11 is contacted to the SiN film 9, a reaction as thermodynamically expressed by the following formula (1) occurs. The direction of the reaction is determined depending on whether the difference ($\Delta G$) of the Gibbs free energy will become negative.

$$SiN+La(O)=La(O)N+Si+\Delta G \qquad \text{Formula (1)}$$

Figure 3:
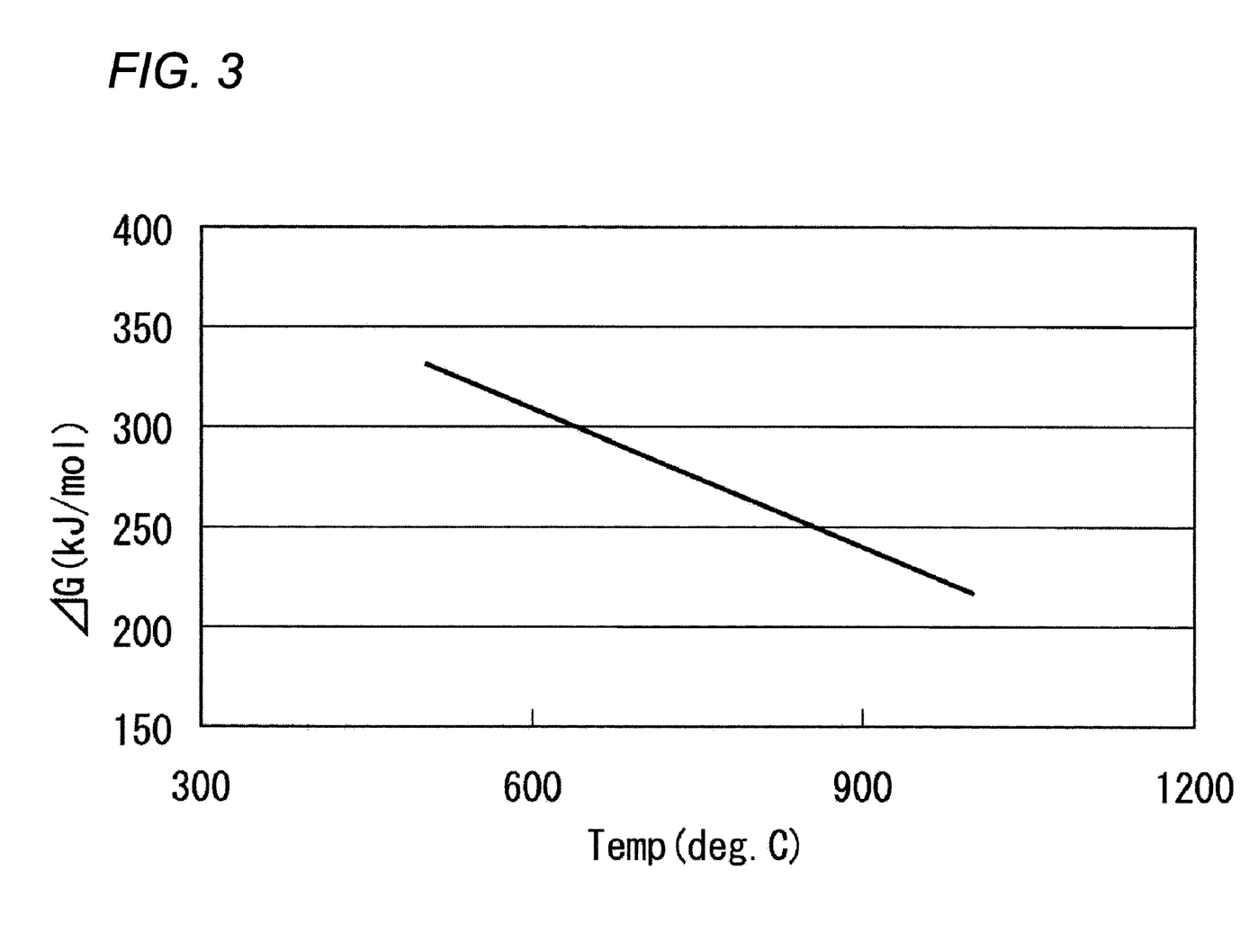
FIG. 3 is a graph illustrating the difference characteristics of the Gibbs free energy in the reaction according to the first embodiment.

As obvious from FIG. 3, in the reaction of the formula (1), since the $\Delta G$ has a positive value at temperatures of the heating process performed in the general semiconductor device fabrication, the reaction of the formula (1) will not proceed to the right side. Therefore, the La elements of the La(O) film 11 cannot pass through the SiN film 9, so that the diffusion of the La elements toward the interface of the silicon substrate 1 of the PMOS region is suppressed.

Figure 2D:
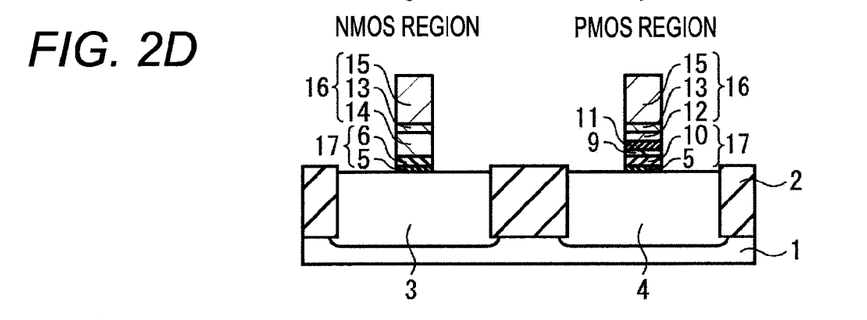

Thereafter, as illustrated in FIG. 2D, a polysilicon film 15 as a gate material is deposited on the TiN film as a barrier metal 13, and an ion implantation is performed on the polysilicon film 15, followed by etching the polysilicon film 15, the TiN film 13, and the WSi film 14, or the W film 12 in order by a photolithography method, thus forming a gate electrode 16. Moreover, using the gate electrode 16 as a mask, the La(O) film 11, the HfSiON film 10, the SiN film 9, the HfSiO film 6, and the $SiO_2$ film 5 are etched in order, thus forming a gate insulating film 17. At this time, an extension ion implantation and a crystal recovery annealing may be adapted.

In the embodiment, when the La(O) film 11 of the FMOS region exists as apart of the gate structure, there is no adverse effect on the device characteristics.

Figure 2E:
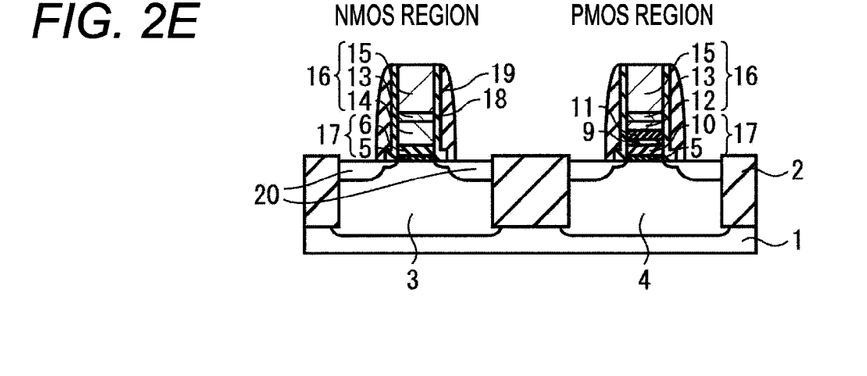

Next, as illustrated in FIG. 2E, a liner film made of SiN is deposited onto the entire upper surfaces of the silicon substrate 1, and then, a TEOS (Tetraethoxysilane) is deposited on the SiN film, and the TEOS and the SiN film are etched by anisotropic etching, thus forming a SiN film 18 and a TEOS film 19 serving as gate sidewalls. Subsequently, using the gate electrode 16 as a mask, an ion implantation of conductive impurities and an activation annealing are performed on the silicon substrate 1, thus forming a source/drain diffusion layer 20.

According to the present embodiment, it is possible to provide the following advantages. After the silicon film 7 is formed on the high-permittivity gate insulating film 6, the silicon film on the PMOS region is substituted with the SiN film 9 by a nitriding treatment while the silicon film 7 on the NMOS region remains unchanged. Here, although the La elements contained in the La(O) film 11 are diffused near the interface of the silicon substrate 1 and the $Sio_2$ film 5 in the NMOS region, the La elements are not diffused to the interface of the silicon substrate 1 and the $SiO_2$ film 5 in the PMOS region since the SiN film 9 blocks the diffusion of the La elements. As a result, the number of fabrication steps is suppressed, and the flat-band voltages are suitably adjusted for both NMOSFETs and PMOSFETs.

In the present embodiment, the silicon film 7 is formed to cover the high-permittivity gate insulating film 6, and the SiN film 9 is formed by nitriding a part of the silicon film 7. As a result, in subsequent steps after the silicon film 7 has been formed, the high-permittivity gate insulating film 6 is prevented from being exposed.

In the present embodiment, the W film 12 is used as the metal electrode, and the TiN film is formed as the barrier metal 13 in order to prevent reaction of the W film 12 with the polysilicon film 15 formed on the metal electrode. The metal electrode may be formed of a transition metal such as Ta and its silicides, nitrides, carbides and the like. The barrier metal 13 may not be formed if the metal electrode material does not react with the polysilicon film 15. The material of the barrier metal 13 is not limited to TiN, and other materials, such as TaC and Ru, capable of preventing reaction between the metal electrode and the polysilicon may be used.

In the present embodiment, the heat treatment is performed in the step shown in FIG. 2B in order that the La elements are diffused near the interface of the silicon substrate and the gate insulating film. However, the heating treatment may be omitted because the phase separation and the La diffusion are sufficiently occurred by the heating process in the source/drain diffusion layer forming step.

In the present embodiment, as a high-permittivity insulating film that is used as the high-permittivity gate insulating film and that has a permittivity higher than that of a silicon oxide film or silicon oxynitride film, a hafnium silicon oxide film containing a metal element, such as Hf, is used. However, other materials may be used which are not easily nitrided, or have low nitrogen concentration even when nitrided, such as a hafnium silicon oxynitride film, a zirconium oxide film, a hafnium oxide film, a hafnium zirconium oxide film, or a hafnium zirconium oxide film.

As the substrate, a SOI (Silicon On Insulator) substrate may be used in addition to the general silicon substrate.

Second Embodiment

In a second embodiment, in addition to the first embodiment steps, a silicon germanium (SiGe) layer is formed, e.g., by an epitaxial growth method in the PMOS region, prior to forming the $SiO_2$ film 5. The present embodiment is substantially same as the first embodiment, except that a SiGe layer is formed, and therefore, the same or similar portions as those of the first embodiment will be denoted by the same reference numerals, and redundant description will be omitted.

Figure 4A:
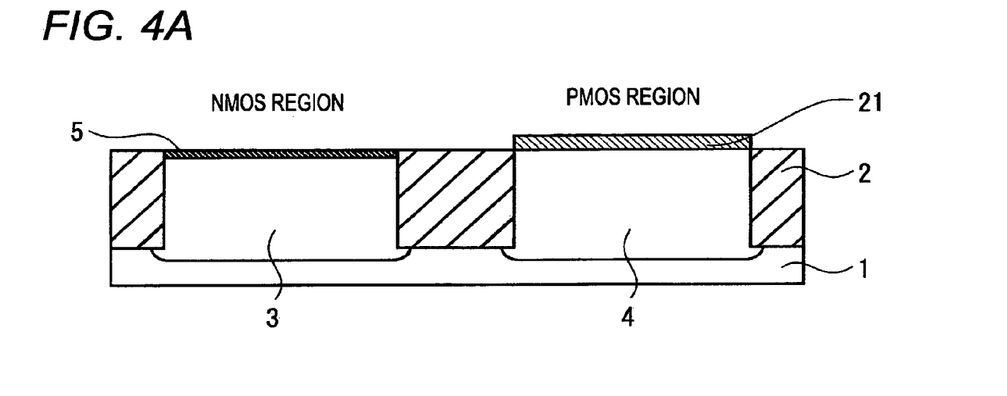
FIGS. 4A and 4B are cross-sectional views schematically illustrating parts of a semiconductor device fabrication method according to a second embodiment of the present invention.
Figure 4B:
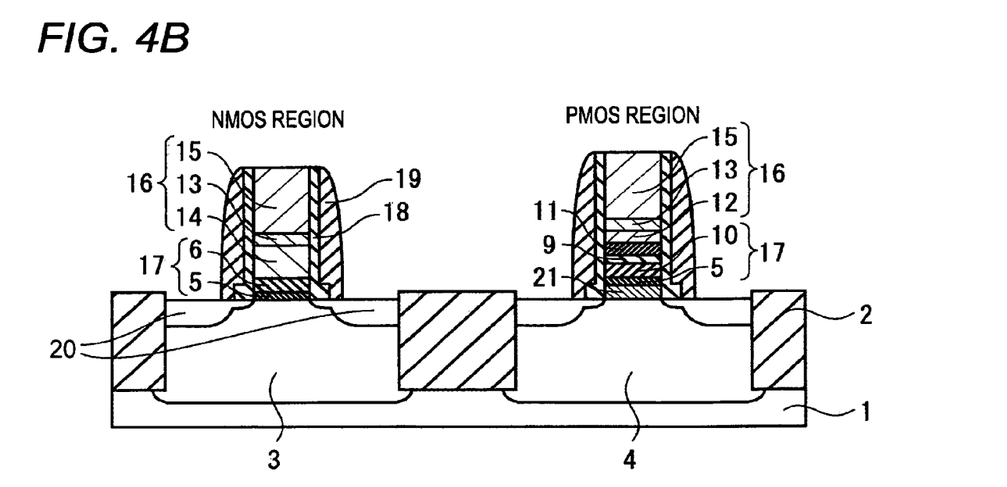

As illustrated in FIG. 4A, a SiGe layer 21 is formed prior to forming the $SiO_2$ film 5. The subsequent steps are similar to those of the first embodiment. After the gate electrode 16 is formed as illustrated in FIG. 4B, using the gate electrode 16 as a mask, an ion implantation of conductive impurities and an activation annealing are performed on the silicon substrate 1, thus forming a source/drain diffusion layer 20.

By forming the SiGe layer 21, it is possible to achieve a low threshold voltage (Vth) lower than that of a conventional silicon-channel transistor. In place of the SiGe layer 21, an $Al_2O_3$ layer or an AlN layer may be formed by a MOCVD (Metal Organic Chemical Vapor Deposition) method or an ALD (Atomic Layer Deposition) method. The $Al_2O_3$ layer or the AlN layer may be formed on the SiGe layer after the SiGe layer has been formed.

According to the present embodiment, in addition to the advantages of the first embodiment, the following advantages can be obtained. That is, by forming the SiGe layer in the PMOS region, it is possible to realize a CMOSFET having a low threshold voltage compared with the first embodiment.

Third Embodiment

FIGS. 5A to 5E and FIGS. 6A to 6D are cross-sectional views illustrating the steps for fabricating a CMOSFET according to a third embodiment of the present invention.

Figure 5A:
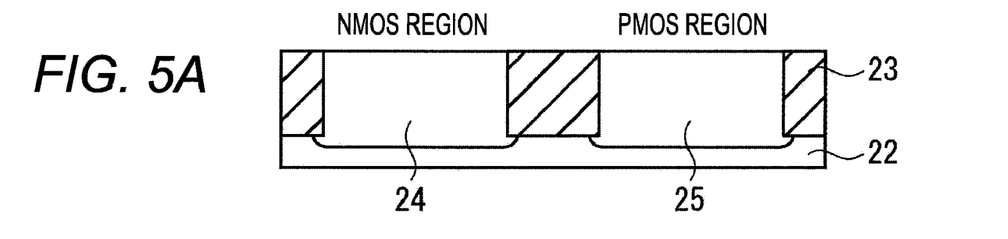
FIGS. 5A to 5E are cross-sectional views schematically illustrating parts of a semiconductor device fabrication method according to a third embodiment of the present invention.

First, as illustrated in FIG. 5A, on a main surface of a silicon substrate 22, a device isolation region 23 having an STI structure is formed by a conventional method so as to define a PMOS region and a NMOS region. Thereafter, a P-well diffusion layer 24 in the NMOS region and an N-well diffusion layer 25 in the PMOS region are formed by a conventional method.

Figure 5B:
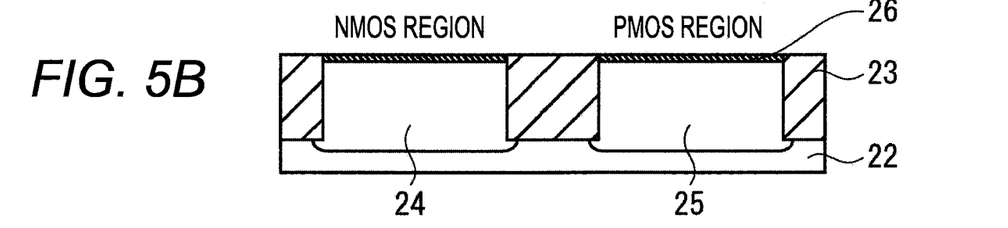

Next, as illustrated in FIG. 5B, the main surface of the silicon substrate 22 is oxidized, e.g., by a heat treatment in an oxygen atmosphere so that a silicon oxide ($SiO_2$) film 26 is formed on the PMOS region and the NMOS region.

Figure 5C:
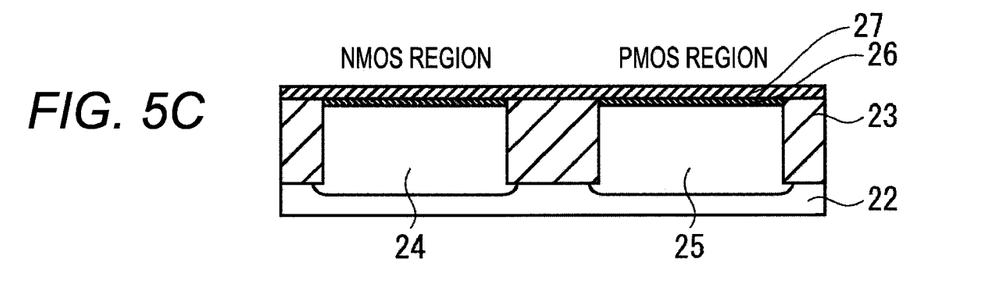

As illustrated in FIG. 5C, subsequent to forming the $SiO_2$ film 26, a HfSiON film as a high-permittivity gate insulating film 27 is deposited on the $Sio_2$ film 26 by a MOCVD method or the like. The nitrogen concentration in the HfSiON film 27 can be arbitrarily changed within the range that does not completely block the diffusion of La elements.

Figure 5D:
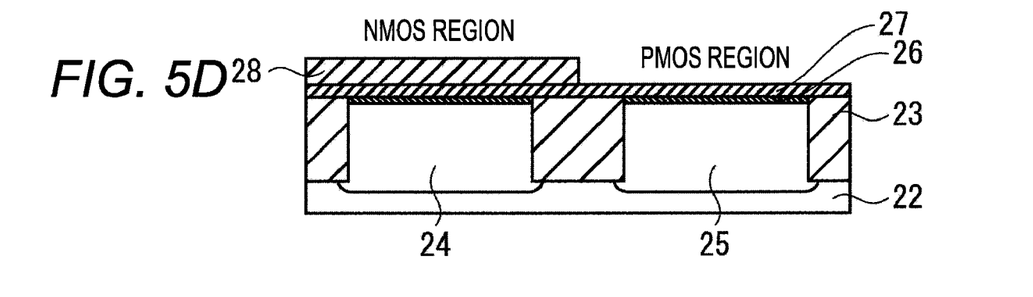
Figure 5E:
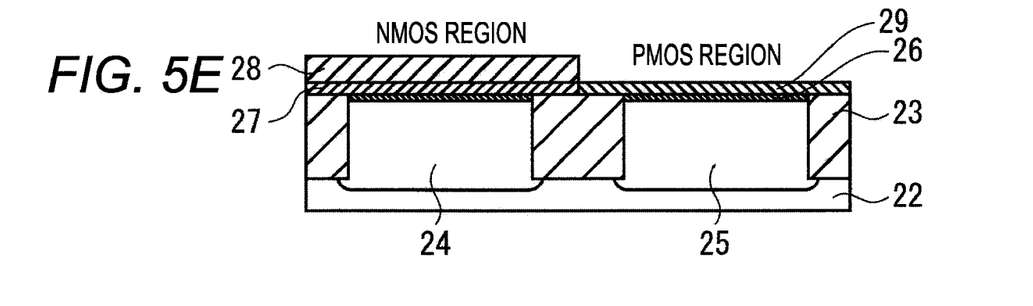

Thereafter, the NMOS region is masked with a resist 28 by a photolithography method or the like as illustrated in FIG. 5D, the HfSiON film 27 of the PMOS region is nitrided, e.g., by a plasma nitriding method, as illustrated in FIG. 5E. In this way, the HfSiON film 27 of the PMOS region is substituted with a nitrided HfSiON film 29, while the HfSiON film 27 of the NMOS region remains unchanged since the NMOS region is covered with the resist 28. The nitrided HfSiON film 29 has a higher nitrogen concentration than that of the HfSiON film 27.

The nitrided HfSiON film 29 has a nitrogen concentration capable of preventing diffusion of Lanthanum elements. For example, the nitrided HfSiON film 29 has a nitrogen concentration greater than around 20 atm % where the concentrations of Hf and of Si are about equal.

Figure 6A:
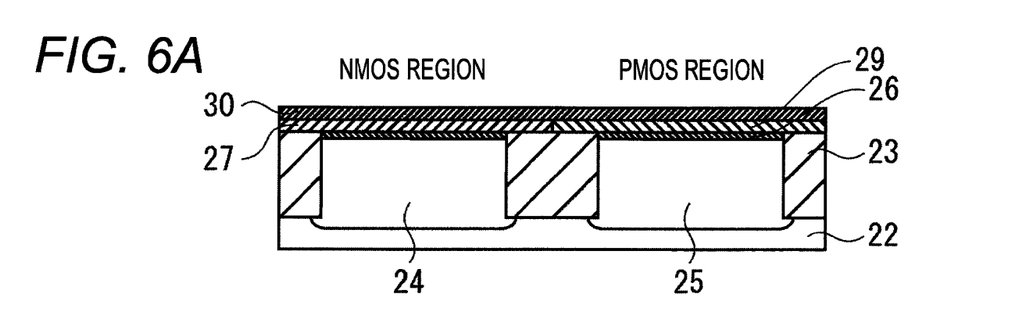
FIGS. 6A to 6D are cross-sectional views schematically illustrating parts of the semiconductor device fabrication method according to the third embodiment.

Next, as illustrated in FIG. 6A, the resist 28 is removed using an organic solvent or the like, and a La film as a cap film is formed on the HfSiON film 27 of the NMOS region and on the nitrided HfSiON film 29 of the PMOS region. In this embodiment, the La film is formed to lower a threshold voltage Vth of an NMOSFET. As the cap film, there may be used, in lieu of Lanthanum, any of lanthanoides, actinoides, alkaline earth metals, and rare-earth metals, as well as yttrium, terbium, erbium, ytterbium, magnesium, and scandium. The La film is slightly oxidized during the process and exists in a state of a La(O) film 30 containing a small amount of oxygen. Similarly, in case of using Magnesium in place of Lanthanum, it is considered that it exists in the slightly oxidized state.

Figure 6B:
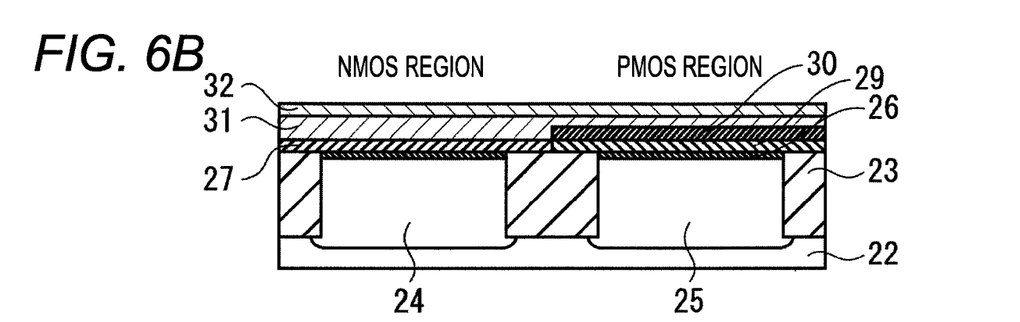

Subsequently, as illustrated in FIG. 6B, a W film 31 as a metal electrode is formed on the La(O) film 30, and a TiN film as a barrier metal 32 is formed on the W film 31. After the TiN film 32 is formed, a heating process is performed whereby the La elements contained in the La(O) film 30 of the NMOS region are diffused near the interface of the silicon substrate 22 and the $SiO_2$ film 26. On the other hand, in the FMOS region, the nitrided HfSiON film 29 blocks the diffusion of the La elements, so that the La elements cannot be diffused toward the interface of the silicon substrate 22.

Figure 6C:
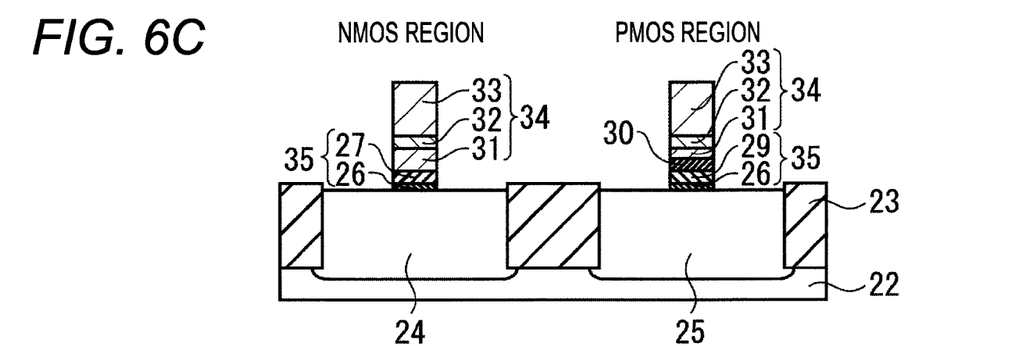

Thereafter, as illustrated in FIG. 6C, a polysilicon film 33 as a gate material is deposited on the TiN film 32, and an ion implantation is performed on the polysilicon film 33, followed by etching the polysilicon film 33, the TiN film 32, and the W film 31 in order by a photolithography method, thus forming a gate electrode 34. Moreover, using the gate electrode 34 as a mask, the La(O) film 30, the nitrided HfSiON film 29, or the HfSiON film 27, and the $SiO_2$ film 26 are etched in order, thus forming a gate insulating film 35. At this time, an extension ion implantation and a crystal recovery annealing may be adapted.

In the embodiment, when the La(O) film 30 of the PMOS region exists as apart of the gate structure, there is no adverse effect on the device characteristics.

Figure 6D:
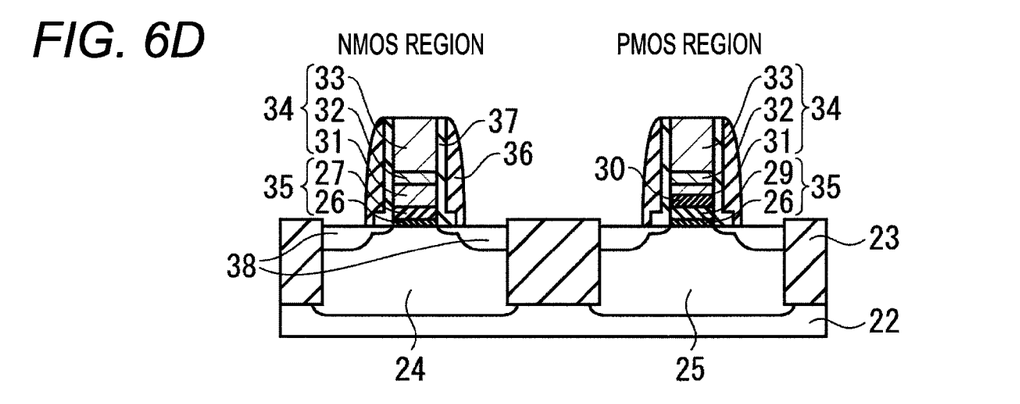

Next, as illustrated in FIG. 6D, a liner film made of SiN is deposited onto the entire upper surfaces of the silicon substrate 22, and then, a TEOS (Tetraethoxysilane) is deposited on the SiN film, and the TEOS and the SiN film are etched by anisotropic etching, thus forming a SiN film 36 and a TEOS film 37 serving as gate sidewalls. Subsequently, using the gate electrode 34 as a mask, an ion implantation and an activation annealing are performed, thus forming a source/drain diffusion layer 38.

According to the present embodiment, it is possible to provide the following advantages. After the HfSiON film 27 is formed on the PMOS region and the NMOS region, the HfSiON film on the PMOS region is substituted with the nitrided HfSiON film 29 having a high nitrogen concentration by a nitriding treatment while the HfSiON film 27 on the NMOS region remains unchanged. Here, although the La elements contained in the La(O) film 30 are diffused near the interface of the silicon substrate 22 and the $SiO_2$ film 26 in the NMOS region, the La elements are not diffused toward the interface of the silicon substrate 22 and the $SiO_2$ film 26 in the PMOS region since the nitrided HfSiON film 29 blocks the diffusion of the La elements. As a result, the number of fabrication steps is suppressed, and the suitable metal electrodes are formed for both NMOSFETs and PMOSFETs.

In the present embodiment, since the diffusion of the La elements in the PMOS region is blocked by directly nitriding the selected part of the HfSiO film functioning as the high-permittivity gate insulating film on the PMOS region, the number of fabrication steps are further decreased as compared with the first embodiment.

In the present embodiment, the W film 31 is used as the metal electrode, and the TiN film is formed as the barrier metal 32 in order to prevent reaction of the W film 31 with the polysilicon film 33 formed on the metal electrode. The metal electrode may be formed of a transition metal such as Ta and its suicides, nitrides, carbides and the like. The barrier metal 32 may not be formed if the metal electrode material does not react with the polysilicon film 33. The material of the barrier metal 32 is not limited to TiN, and other materials, such as TaC and Ru, capable of preventing reaction between the metal electrode and the polysilicon may be used.

In the present embodiment, the heat treatment is performed in the step shown in FIG. 6B in order that the La elements are diffused near the interface of the silicon substrate and the gate insulating film. However, the heating treatment may be omitted because the phase separation and the La diffusion are sufficiently occurred by the heating process in the source/drain diffusion layer forming step.

In the present embodiment, the hafnium silicon nitride film is used as the high-permittivity gate insulating film 27, However, other materials maybe used which can achieve a nitrogen concentration capable of preventing diffusion of the constituent elements of the cap film by performing a nitriding treatment, such as a hafnium silicon oxide film, a zirconium silicon oxide film, a zirconium silicon nitride film, a hafnium zirconium silicon oxide film, or a hafnium zirconium silicon nitride film.

As the substrate, a SOI (Silicon On Insulator) substrate may be used in addition to the general silicon substrate.

Fourth Embodiment

In a fourth embodiment, in addition to the third embodiment steps, a SiGe layer is formed, e.g., by an epitaxial growth method in the PMOS region, prior to forming the $SiO_2$ film 26. The present embodiment is substantially same as the third embodiment, except that a SiGe layer is formed, and therefore, the same or similar portions as those of the third embodiment will be denoted by the same reference numerals, and redundant description will be omitted.

Figure 7A:
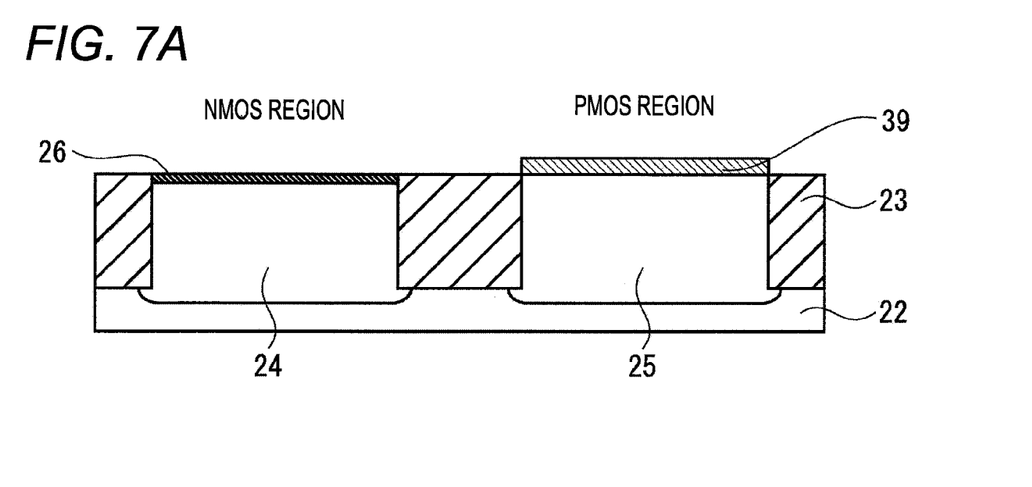
FIGS. 7A and 7B are cross-sectional views schematically illustrating parts of a semiconductor device fabrication method according to a fourth embodiment of the present invention.
Figure 7B:
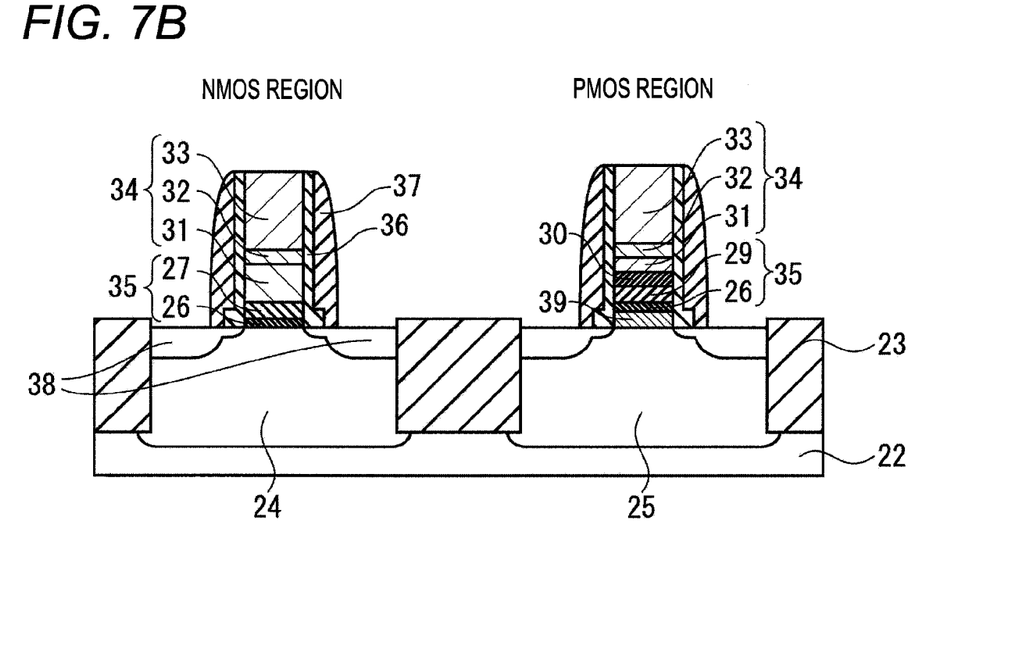

As illustrated in FIG. 7A, a SiGe layer 39 is formed prior to forming the $SiO_2$ film 26. The subsequent steps are similar to those of the third embodiment. After the gate electrode 34 is formed as illustrated in FIG. 7B, using the gate electrode 34 as a mask, an ion implantation of conductive impurities and an activation annealing are performed on the silicon substrate 22, thus forming a source/drain diffusion layer 38.

By forming the SiGe layer 39, it is possible to achieve a low threshold voltage (Vth) lower than that of a conventional silicon-channel transistor. In place of the SiGe layer, an $Al_2O_3$ layer or an AlN layer may be formed by a MOCVD (Metal Organic Chemical Vapor Deposition) method or an ALD (Atomic Layer Deposition) method. The $Al_2O_3$ layer or the AlN layer may be formed on the SiGe layer after the SiGe layer has been formed.

According to the present embodiment, in addition to the advantages of the third embodiment, the following advantages can be obtained. That is, by forming the SiGe layer in the PMOS region, it is possible to realize a CMOSFET having a low threshold voltage compared with the third embodiment.

Fifth Embodiment

Next, a semiconductor device fabrication method according to a fifth embodiment of the present invention will be described. FIGS. 8A to 8E and FIGS. 5A to 5D are cross-sectional views illustrating the semiconductor device fabrication method according to the fifth embodiment of the present invention. The fabrication steps will be described below with reference to FIGS. 8A to 8E and FIGS. 9A to 9D.

Figure 8A:
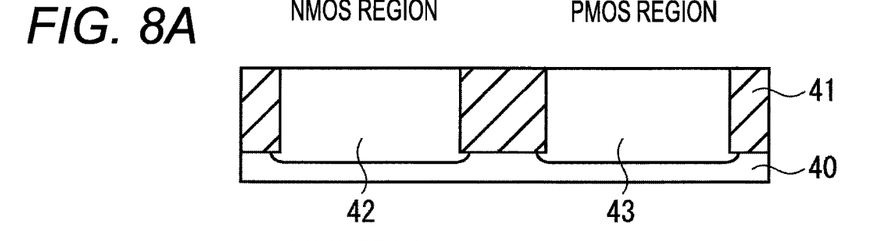
FIGS. 8A to 8E are cross-sectional views schematically illustrating parts of a semiconductor device fabrication method according to a fifth embodiment of the present invention.

First, as illustrated in FIG. 8A, on a main surface of a silicon substrate 40, a device isolation region 41 having an STI structure is formed by a conventional method so as to define a PMOS region and a NMOS region. Thereafter, a P-well diffusion layer 42 in the NMOS region and an N-well diffusion layer 43 in the PMOS region are formed by a conventional method.

Figure 8B:
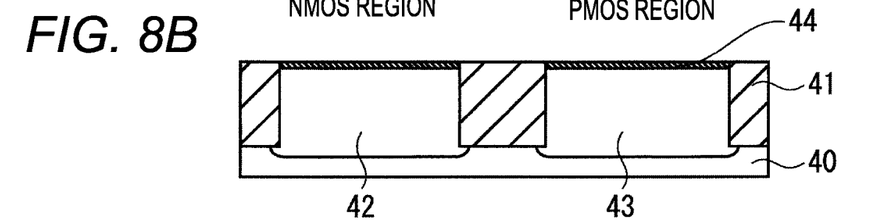

Next, as illustrated in FIG. 8B, the main surface of the silicon substrate 40 is oxidized, e.g., by a heat treatment in an oxygen atmosphere so that a silicon oxide ($SiO_2$) film 44 is formed on the PMOS region and the NMOS region.

Figure 8C:
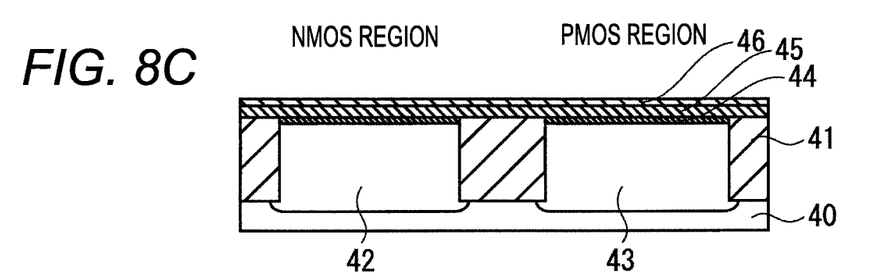

Subsequent to forming the $SiO_2$ film 44, as illustrated in FIG. 8C, a hafnium silicon oxide (HfSiO) film as a high-permittivity gate insulating film is deposited on the $SiO_2$ film 44 by a MOCVD method or the like. With respect to the HfSiO film deposited on the $SiO_2$ film 44, nitriding and annealing processes are performed, thus forming a hafnium silicon nitride (HfSiON) film 45. The nitrogen concentration in the HfSiON film 45 can be arbitrarily changed within the range that does not completely block the diffusion of La elements. Instead of nitriding the HfSiO film, a HfSiON film may be deposited directly on the $SiO_2$ film 44 by a MOCVD method or the like.

Subsequently, an extremely thin silicon nitride (SiN) film 46 is formed on the HfSiON film 45, e.g., by an ALD method, a CVD method, or the like. The SiN film 46 has a thickness capable of preventing diffusion of Lanthanum elements, for example, of about 0.5 to 1.0 nm. The SiN film 46 may be formed to have a larger thickness as long as the device characteristics are satisfied.

Figure 8D:
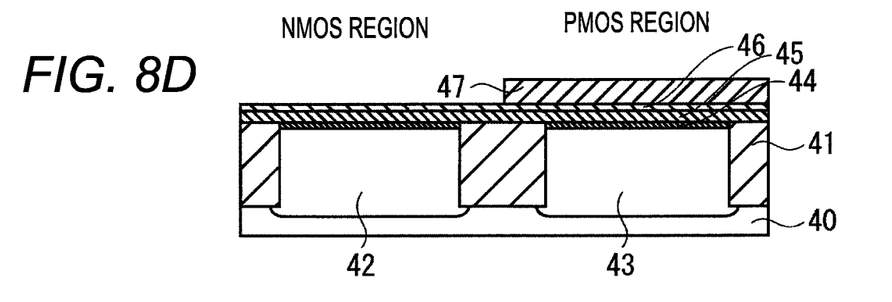
Figure 8E:
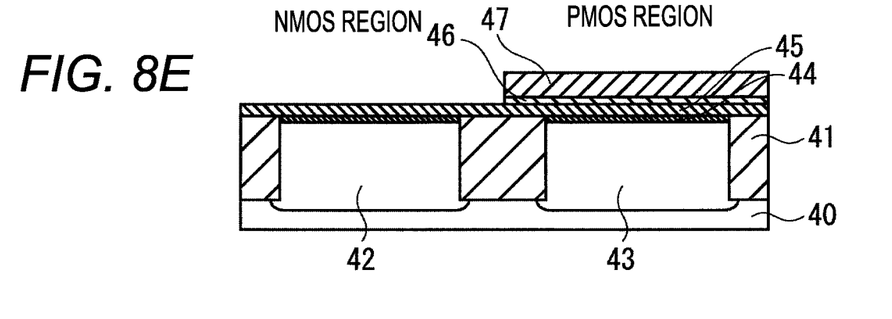

Thereafter, the PMOS region is masked with a resist 47 by a photolithography method or the like as illustrated in FIG. 8D, and the SiN film 46 of the NMOS region is removed, e.g., by a selective etching using phosphoric acid as illustrated in FIG. 8E.

Figure 9A:
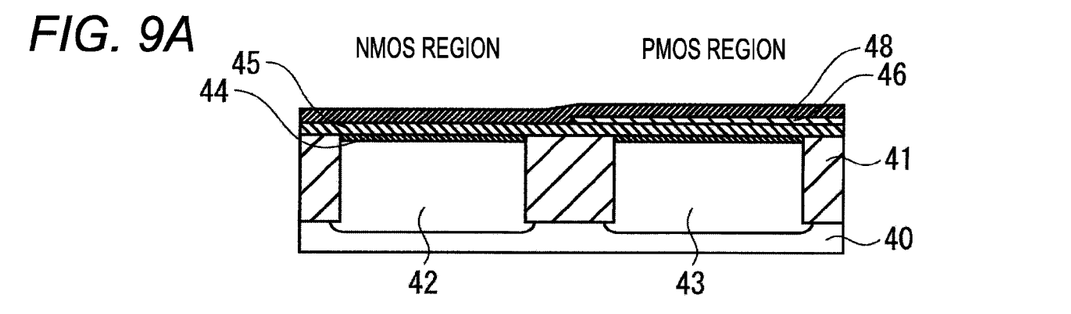
FIGS. 9A to 9D are cross-sectional views schematically illustrating parts of the semiconductor device fabrication method according to the fifth embodiment.

Next, as illustrated in FIG. 9A, the resist 47 is removed using an organic solvent or the like, and a lanthanum oxide ($La_2O_3$) film 48 as a cap film is formed on the HfSiON film 45 of the NMOS region and on the SiN film 46 of the PMOS region. In this embodiment, the $La_2O_3$ film is formed to lower a threshold voltage Vth of an NMOSFET. A lanthanum film may be formed in place of the $La_2O_3$ film. As the cap film, there may be used, in lieu of Lanthanum, any of lanthanoides, actinoides, alkaline earth metals, and rare-earth metals, as well as yttrium, terbium, erbium, ytterbium, magnesium, and scandium. The La film is slightly oxidized during the process and exists in a state of a La(O) film containing a small amount of oxygen. Similarly, in case of using Magnesium in place of Lanthanum, it is considered that it exists in the slightly oxidized state.

Figure 9B:
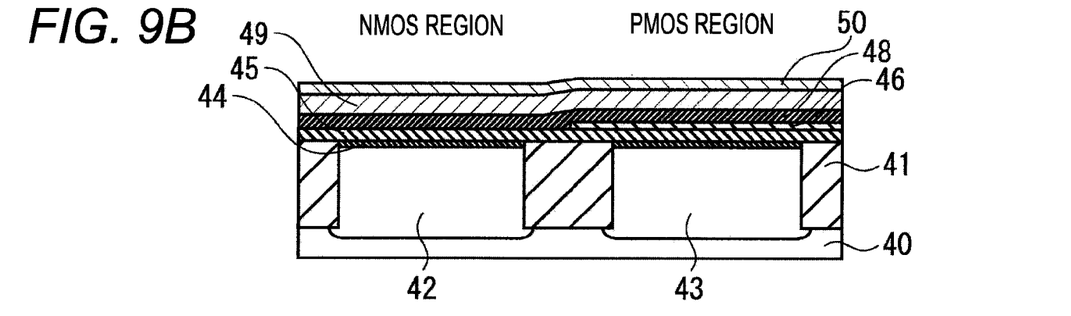

Subsequently, as illustrated in FIG. 9B, a W film 49 as a metal electrode is formed on the $La_2O_3$ film 48, and a TiN film as a barrier metal 50 is formed on the W film 49. After the TiN film 50 is formed, a heating process is performed whereby the La elements contained in the $La_2O_3$ film 48 of the NMOS region are diffused near the interface of the silicon substrate 40 and the $SiO_2$ film 44. On the other hand, in the PMOS region, the SiN film 46 blocks the diffusion of the La elements, so that the La elements cannot be diffused toward the interface of the silicon substrate 40.

Figure 9C:
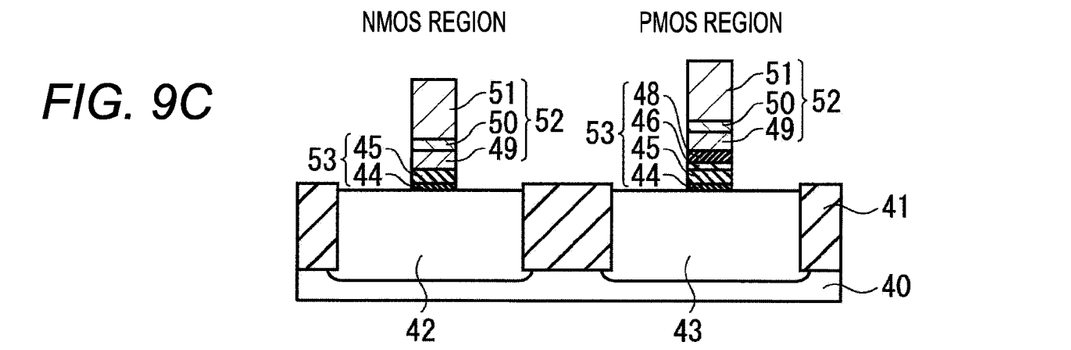

Thereafter, as illustrated in FIG. 9C, a polysilicon film 51 as a gate material is deposited on the TiN film 50, and an ion implantation is performed on the polysilicon film 51, followed by etching the polysilicon film 51, the TiN film 50, and the W film 49 in order by a photolithography method, thus forming a gate electrode 52. Moreover, using the gate electrode 52 as a mask, the $La_2O_3$ film 48, the SiN film 46, the HfSiON film 45, and the $SiO_2$ film 44 are etched in order, thus forming a gate insulating film 53. At this time, an extension ion implantation and a crystal recovery annealing may be adapted.

Figure 9D:
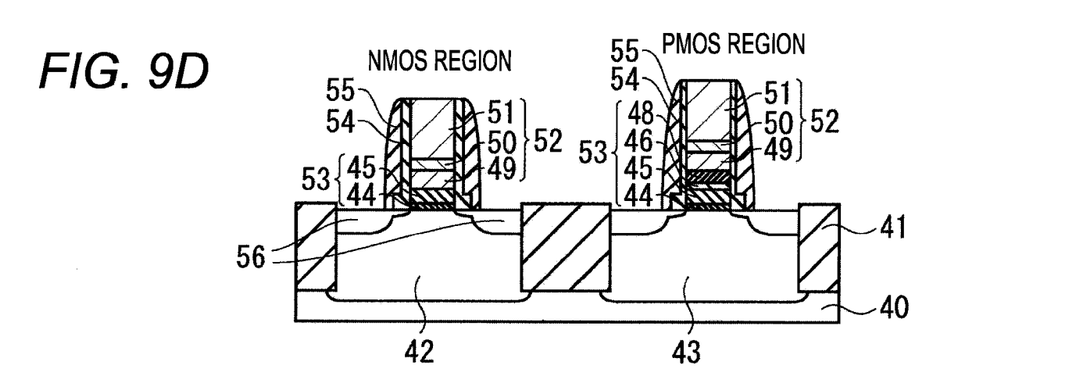

Next, as illustrated in FIG. 9D, a liner film made of SiN is deposited onto the entire upper surfaces of the silicon substrate 40, and then, a TEOS (Tetraethoxysilane) is deposited on the SiN film, and the TEOS and the SiN film are etched by anisotropic etching, thus forming a SiN film 54 and a TEOS film 55 serving as gate sidewalls. Subsequently, using the gate electrode 52 as a mask, an ion implantation of conductive impurities and an activation annealing are performed, thus forming a source/drain diffusion layer 56.

According to the present embodiment, it is possible to provide the following advantages. The SiN film 46 is formed on the PMOS region. Here, although the La elements contained in the $La_2O_3$ film 48 are diffused near the interface of the silicon substrate 40 and the $SiO_2$ film 44 in the NMOS region, the La elements are not diffused toward the interface of the silicon substrate 40 and the $SiO_2$ film 44 in the PMOS region since the SiN film 46 blocks the diffusion of the La elements. As a result, the number of fabrication steps is suppressed, and the suitable metal electrodes are formed for both NMOSFETs and PMOSFETs.

In the first embodiment, the silicon film 7 remains on the NMOS region, so that it reacts with the W film 12 to thereby form the silicide electrode 14. However, in the present embodiment, since the W film can be used as the electrode without being silicided, it is possible to realize a higher operation speed. Since the step of nitriding the resist film is not performed, the peering characteristic of the resist film can be maintained high as compared with the first to fourth embodiments.

In the present embodiment, the W film 49 is used in the metal electrode, and the TiN film is formed as the barrier metal 50 in order to prevent reaction of the W film 49 with the polysilicon film 51 formed on the metal electrode. The metal electrode may be formed of a transition metal such as Ta and its suicides, nitrides, carbides and the like. The barrier metal 50 may not be formed if the metal electrode material does not react with the polysilicon film 51. The material of the barrier metal 50 is not limited to TiN, and other materials, such as TaC and Ru, capable of preventing reaction between the metal electrode and the polysilicon may be used.

In the present embodiment, the heat treatment is performed in the step shown in FIG. 9B in order that the La elements are diffused near the interface of the silicon substrate and the gate insulating film. However, the heating treatment may be omitted because the phase separation and the La diffusion are sufficiently occurred by the heating process in the source/drain diffusion layer forming step.

In the present embodiment, the hafnium silicon nitride film is used as the high-permittivity gate insulating film 45. However, other materials may be used which can achieve a nitrogen concentration capable of preventing diffusion of the constituent elements of the cap film by performing a nitriding treatment, such as a hafnium silicon oxide film, a zirconium silicon oxide film, a zirconium silicon nitride film, a hafnium zirconium silicon oxide film, or a hafnium zirconium silicon nitride film.

As the substrate, a SOI (Silicon On Insulator) substrate may be used in addition to the general silicon substrate.

Sixth Embodiment

In a sixth embodiment, in addition to the fifth embodiment steps, a SiGe layer is formed, e.g., by an epitaxial growth method in the PMOS region, prior to forming the SiO$_2$ film 44 in the fifth embodiment. The present embodiment is substantially same as the fifth embodiment, except that a SiGe layer is formed, and therefore, the same or similar portions as those of the fifth embodiment will be denoted by the same reference numerals, and redundant description will be omitted.

Figure 10A:
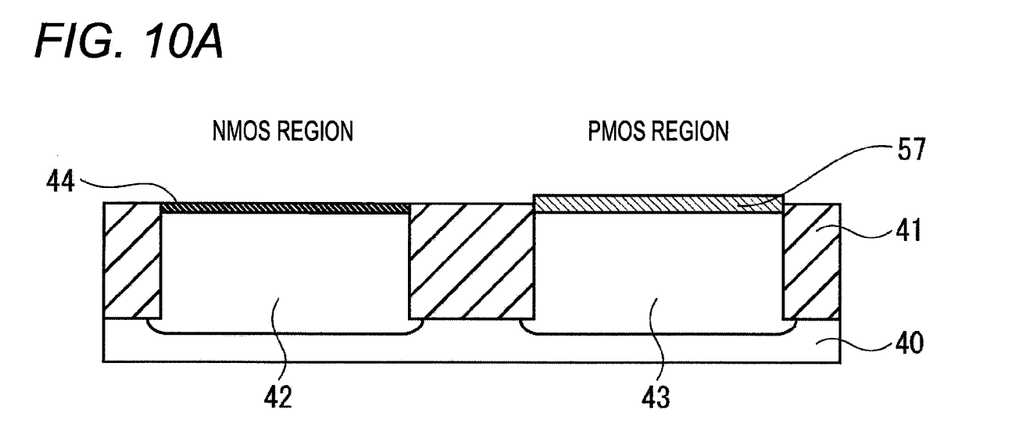
FIGS. 10A and 10B are cross-sectional views schematically illustrating parts of a semiconductor device fabrication method according to a sixth embodiment of the present invention.
Figure 10B:
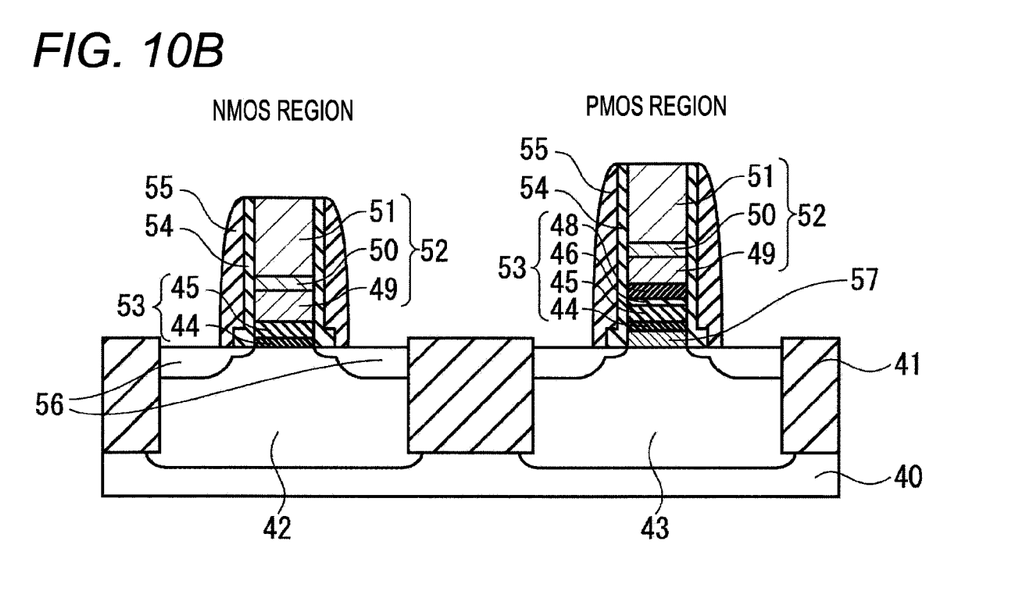

As illustrated in FIG. 10A, a SiGe layer 57 is formed prior to forming the SiO$_2$ film 44. The subsequent steps are similar to those of the fifth embodiment. After the gate electrode 52 is formed as illustrated in FIG. 10B, using the gate electrode 52 as a mask, an ion implantation of conductive impurities and an activation annealing are performed on the silicon substrate 40, thus forming a source/drain diffusion layer 56.

By forming the SiGe layer 57, it is possible to achieve a low threshold voltage (Vth) lower than that of a conventional silicon-channel transistor. In place of the SiGe layer, an Al$_2$O$_3$ layer or an AlN layer may be formed by a MOCVD method or an ALD method. The Al$_2$O$_3$ layer or the AlN layer may be formed on the SiGe layer after the SiGe layer has been formed.

According to the present embodiment, in addition to the advantages of the fifth embodiment, the following advantages can be obtained. That is, by forming the SiGe layer in the PMOS region, it is possible to realize a CMOSFET having a low threshold voltage compared with the fifth embodiment.

The present invention is not limited to the above-described embodiments, but may be modified in various ways without departing from the spirit of the invention.

According to an aspect of the present invention, a fabrication method of a metal gate CMOS using a high-permittivity gate insulating film and a metal gate electrode is simplified.

What is claimed is:

1. A method for fabricating a semiconductor device, the method comprising:
   forming a first region and a second region in a substrate;
   forming a high-permittivity insulating film on the substrate in the first region and in the second region;
   forming a nitride film on the high-permittivity insulating film in the second region;
   forming a cap film on the high-permittivity insulating film in the first region and on the nitride film in the second region;
   forming a metal film on the cap film; and
   performing a heating process to introduce a constituent element of the cap film into the high permittivity insulating film in the first region.

2. The method according to claim 1,
   wherein the first region includes an NMOS formation region on which an NMOS transistor is formed,
   wherein the second region includes a PMOS formation region on which a PMOS transistor is formed,
   wherein the high-permittivity insulating film includes a high-permittivity gate insulating film, and
   wherein the metal film includes a metal gate electrode film.

3. The method according to claim 1,
   wherein, in the second region, the nitride film blocks a constituent element of the cap layer from being introduced into the high permittivity insulating film.

4. The method according to claim 1,
   wherein a step of forming the nitride film includes:
      forming a silicon film on the high permittivity insulating film in the first region and in the second region;
      forming a resist film on the silicon film in the first region;
      substituting the silicon film into a silicon nitride film in the second region by performing a nitriding process; and
      removing the resist film, and
   wherein the cap film is formed on the silicon film in the first region and on the silicon nitride film in the second region.

5. The method according to claim 1,
   wherein a step of forming the nitride film includes:
      forming a silicon nitride film on the high permittivity insulating film in the first region and in the second region;
      forming a resist film on the silicon nitride film in the first region;
      removing the silicon nitride film in the first region by performing an etching process; and
      removing the resist film, and
   wherein the cap film is formed on the high permittivity insulating film in the first region and on the silicon nitride film in the second region.

6. The method according to claim 1,
   wherein the high permittivity insulating film includes at least one material selected from a group consisting of:
   a hafnium; and
   a zirconium.

* * * * *